United States Patent
Wang et al.

(10) Patent No.: US 7,777,586 B2
(45) Date of Patent: Aug. 17, 2010

(54) MULTI-BRAND ELECTRONIC APPARATUS AND MULTI-BAND SIGNAL PROCESSING METHOD

(75) Inventors: Yi-Fong Wang, Taipei (TW); Wei-Kung Deng, Taipei (TW)

(73) Assignee: Richwave Technology Corp., Taipei (TW)

( * ) Notice: Subject to any disclaimer, the term of this patent is extended or adjusted under 35 U.S.C. 154(b) by 134 days.

(21) Appl. No.: 12/107,532

(22) Filed: Apr. 22, 2008

(65) Prior Publication Data

US 2009/0066436 A1    Mar. 12, 2009

(30) Foreign Application Priority Data

Sep. 12, 2007   (TW) .............................. 96134010 A

(51) Int. Cl.
*H03B 5/12*   (2006.01)
(52) U.S. Cl. .............................. 331/179; 331/2; 331/46; 331/49; 331/56
(58) Field of Classification Search ...................... 331/2, 331/46, 49, 56, 179; 332/119
See application file for complete search history.

(56) References Cited

U.S. PATENT DOCUMENTS

| | | | |
|---|---|---|---|
| 4,510,461 A * | 4/1985 | Dickes et al. ............... | 331/1 A |
| 5,598,130 A * | 1/1997 | Mesuda et al. .............. | 332/119 |
| 5,909,149 A * | 6/1999 | Bath et al. ...................... | 331/2 |
| 6,731,712 B1 * | 5/2004 | Lindstrom et al. .......... | 375/376 |
| 6,785,525 B2 * | 8/2004 | Ries ........................... | 455/258 |
| 6,954,626 B2 * | 10/2005 | Teramoto .................... | 455/264 |
| 7,023,283 B2 * | 4/2006 | Kawasumi et al. ............. | 331/2 |
| 2005/0237117 A1 * | 10/2005 | Vu et al. ....................... | 331/2 |

* cited by examiner

*Primary Examiner*—Joseph Chang
*Assistant Examiner*—Jeffrey Shin
(74) *Attorney, Agent, or Firm*—Muncy, Geissler, Olds & Lowe, PLLC

(57) ABSTRACT

A multi-band electronic apparatus and method thereof is provided. The method comprises outputting a first output signal in the first band by a first voltage controlled oscillator according to a switch control signal and a control voltage, outputting a second output signal in the second band by a second voltage controlled oscillator according to the switch control signal and the control voltage, the second band being not completely overlapped by the first band, performing frequency division selectively on the first output signal or the second frequency divided signal according to the switch control signal, and outputting a first frequency divided signal, determining a phase difference between the first frequency divided signal and a reference signal to output a phase difference signal, outputting the control voltage according to the phase difference signal, and selectively driving the first or the second voltage controlled oscillators by the control voltage according to the switch control signal.

20 Claims, 12 Drawing Sheets

MULTI-BRAND ELECTRONIC APPARATUS AND MULTI-BAND SIGNAL PROCESSING METHOD

BACKGROUND OF THE INVENTION

1. Field of the Invention

The invention relates in general to a frequency synthesizer of a phase locked loop, and in particular, to a multi-band frequency synthesizer of a phase locked loop capable of synthesizing multi-frequency in multi-bands.

2. Description of the Related Art

A phase locked loop (PLL) is an electronic control system, locking in the phase of a reference signal. FIG. 1 is a block diagram of conventional PLL 100. PLL 100 comprises phase detector 110, loop filter 120, and voltage controlled oscillator (VCO) 130. Phase detector 110 is typically a mixer, comparing reference signal $S_{ref}$ and output signal $S_{vco}$ from voltage controlled oscillator 130 in terms of both their frequency and phase difference, and outputting a difference signal to loop filter 120. Loop filter 120 drives voltage controlled oscillator 130 according to the difference signal, so that the phase difference between output signal $S_{vco}$ of voltage controlled oscillator 130 and reference signal $S_{ref}$ remains at a constant level, i.e., output signal $S_{vco}$ locks to reference signal $S_{ref}$ at an identical frequency.

Phase locked loops are being applied in a variety of telecommunication and electronic applications, e.g., frequency synthesis, carrier or timing recovery, and frequency modulation/demodulation. FIG. 2 is a block diagram of a conventional. PLL frequency synthesizer 200. PLL frequency synthesizer 200 comprises phase detector 210, loop filter 220, voltage controlled oscillator 230, and frequency divider 240. The difference between PLL frequency synthesizer 200 and 100 lies in that output signal $S_{vco}$ of voltage controlled oscillator 230 is transmitted to frequency divider 240, and not transmitted to phase detector 210 instead. Frequency divider 240 divides the frequency of output signal $S_{vco}$ of voltage controlled oscillator 230 by N, and then outputs frequency divided signal $S_{div}$ to phase detector 210 for a comparison with the reference signal. When frequency divided signal $S_{div}$ locks to reference signal $S_{ref}$ both signals have an identical frequency, and the frequency of output signal $S_{vco}$ is N times that of reference signal $S_{ref}$. Thus we can change the frequency division divisor of frequency divider 240 to generate a plurality of output signal $S_{vco}$ with stable frequencies.

Telecommunication and electronic apparatuses are being required to comply with more specifications and regulations as technology advances, for example, a handheld apparatus compliant with both IEEE 802.11b/g and 802.11a, or a handset compliant with Cellular Band (900 MHz) and PCS Band (1900 MHz) specifications. Typically, the differences between frequency bands used by the telecommunication specifications are large, such that a single voltage controlled oscillator cannot cover spectrum requirements of the all PLL frequency synthesizers for various telecommunication specifications. Thus, an electronic telecommunication apparatus is required to include PLL frequency synthesizers for different operation bands to support various telecommunication standards, to comply with telecommunication specification requirements at different bands. Consequently, system complexity and manufacturing costs are increased.

It is desirable to share some components in the PLL frequency synthesizer, while forming a multi-band of PLL synthesizer, to drastically decrease system complexity and cost of electronic telecommunication apparatuses supporting various telecommunication standards.

Thus a need exists for a PLL frequency synthesizer in an electronic telecommunication apparatus compliant with multiple telecommunication specifications, capable of sharing a specific component and switching mechanism, and reducing system complexity and cost, while meeting specific design specifications.

BRIEF SUMMARY OF THE INVENTION

A detailed description is given in the following embodiments with reference to the accompanying drawings.

A multi-band electronic apparatus is disclosed, comprising a first circuit, a second circuit, and a third circuit. The first circuit comprises a first voltage controlled oscillator and a first switch set. The first voltage controlled oscillator outputs a first output signal in the first band according a control voltage. The first switch set, coupled to the first voltage controlled oscillator, selectively enables the first voltage controlled oscillator to output the first output signal according to a switch control signal. The second circuit comprises a second voltage controlled oscillator, a second frequency divider, and a second switch set. The second voltage controlled oscillator outputs a second output signal in the second band according the control voltage, wherein the first and second bands are not completely overlapped. The second frequency divider, coupled to the second voltage controlled oscillator, divides the second output signal to output a second frequency divided signal which frequency is located in or close to the first frequency band. The second switch set, coupled to the second voltage controlled oscillator and the second frequency divider, selectively enables the second voltage controlled oscillator to output the second output signal and the second frequency divider to output the second frequency divided signal. The third circuit comprises a first frequency divider, a phase detector, and a loop filter. The first frequency divider divides the first output signal or the second frequency divided signal to output a first frequency divided signal. The phase detector, coupled to the first frequency divider, receives the first frequency divided signal and a reference signal, determines a phase difference between the first frequency divided signal and the reference signal to output a phase difference signal. The loop filter, coupled to the phase detector, outputs the control voltage according to the phase difference signal. The frequency of the second frequency divided signal and the first output signal is located in or close to the first band, therefore the third circuit, PLL, can be shared in the multi-band electronic apparatus.

According to another embodiment of the invention, a multi-band electronic apparatus is provided, comprising a first circuit, a second circuit, and a third circuit. The first circuit comprises a first voltage controlled oscillator outputting a first output signal in the first band according a control voltage. The second circuit comprises a second voltage controlled oscillator and a second frequency divider. The second voltage controlled oscillator outputs a second output signal in the second band according a control voltage, wherein the first and second bands are not completely overlapped. The second frequency divider, coupled to the second voltage controlled oscillator, divides the second output signal to output a second frequency divided signal which frequency is located in or close to the first frequency band. The third circuit comprises a first frequency divider, a phase detector, a loop filter, and a control signal switch. The first frequency divider divides frequency of the first output signal or the second frequency divided signal to output a first frequency divided signal. The phase detector, coupled to the first frequency divider, receives a first frequency divided signal and a reference signal, and determines a phase difference between a first frequency divided signal and a reference signal to output a phase difference signal. The loop filter, coupled to the phase detector, outputs a control voltage according to the phase difference signal. The control signal switch, selectively controls the first voltage controlled oscillator to output the first output signal to the first frequency divider and controls the loop filter to output the control voltage to the first voltage controlled oscillator, or controls the second voltage controlled oscillator to output the second output signal and the second frequency divider to output the second frequency divided signal to the first frequency divider, and the loop filter to output the control voltage to the second voltage controlled oscillator. The frequency of the second frequency divided signal and the first output signal is located in or close to the first band, therefore the third circuit, PLL, can be shared in the multi-band electronic apparatus.

According to yet another embodiment of the invention, a method for processing multi-band signals is disclosed, comprising outputting a first output signal in the first band selectively according to a switch control signal, the first output signal being outputted by a first voltage controlled oscillator according to a control voltage, outputting a second output signal in the second band selectively according to the switch control signal, the second output signal being outputted by a second voltage controlled oscillator according to the control voltage, and the second band being not completely overlapped with the first band, performing frequency division selectively on the first output signal or the second output signal according to the switch control signal, and outputting a first frequency divided signal, determining a phase difference between the first frequency divided signal and a reference signal to output a phase difference signal, outputting the control voltage according to the phase difference signal, and selectively driving the first or the second voltage controlled oscillators, by the control voltage, according to the switch control signal.

According to still another embodiment of the invention, a method for processing multi-band signals, comprising outputting a first output signal in the first band selectively according to a switch control signal, and the first output signal being outputted by a first voltage controlled oscillator according to a control voltage, outputting a second output signal in the second band selectively, according to the switch control signal, and the second output signal output by a second voltage controlled oscillator according to the control voltage, and the second band being not completely overlapped with the first band, performing frequency division selectively on the first output signal or the second output signal according to the switch control signal, and outputting a first frequency divided signal, determining a phase difference between the first frequency divided signal and a reference signal to output a phase difference signal, generating a filtered signal according to the phase difference signal, adding the filtered signal and baseband analog or digital signal to generate the control voltage, and selectively modulating the first or the second voltage controlled oscillators, by the control voltage, according to the switch control signal.

According to still yet another embodiment of the invention, a multi-band electronic apparatus comprises a phase detector, a loop filter, a first voltage controlled oscillator, a first frequency divider, a second voltage controlled oscillator, a second frequency divider, and a selection device. The phase detector receives a reference signal and a frequency divided signal, and determines a phase difference between the frequency divided signal and the reference signal to output a phase difference signal. The loop filter, coupled to the phase detector, outputs a control voltage according to the voltage difference signal. The first voltage controlled oscillator, coupled to the loop filter, outputs a first output signal in the first band upon reception of the control voltage. The first frequency divider, coupled to the first voltage controlled oscillator, performs frequency division on the first output signal to output a first frequency divided signal. The second voltage controlled oscillator, coupled to the loop filter, outputs a second output signal in the second band upon reception of the control voltage. The second frequency divider, coupled to the second voltage controlled oscillator, performs frequency division on the second output signal to output a second frequency divided signal. The first frequency divided signal and the second frequency divided signal are selectively coupled to phase detector by a first switch and a second switch according to a switch control signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
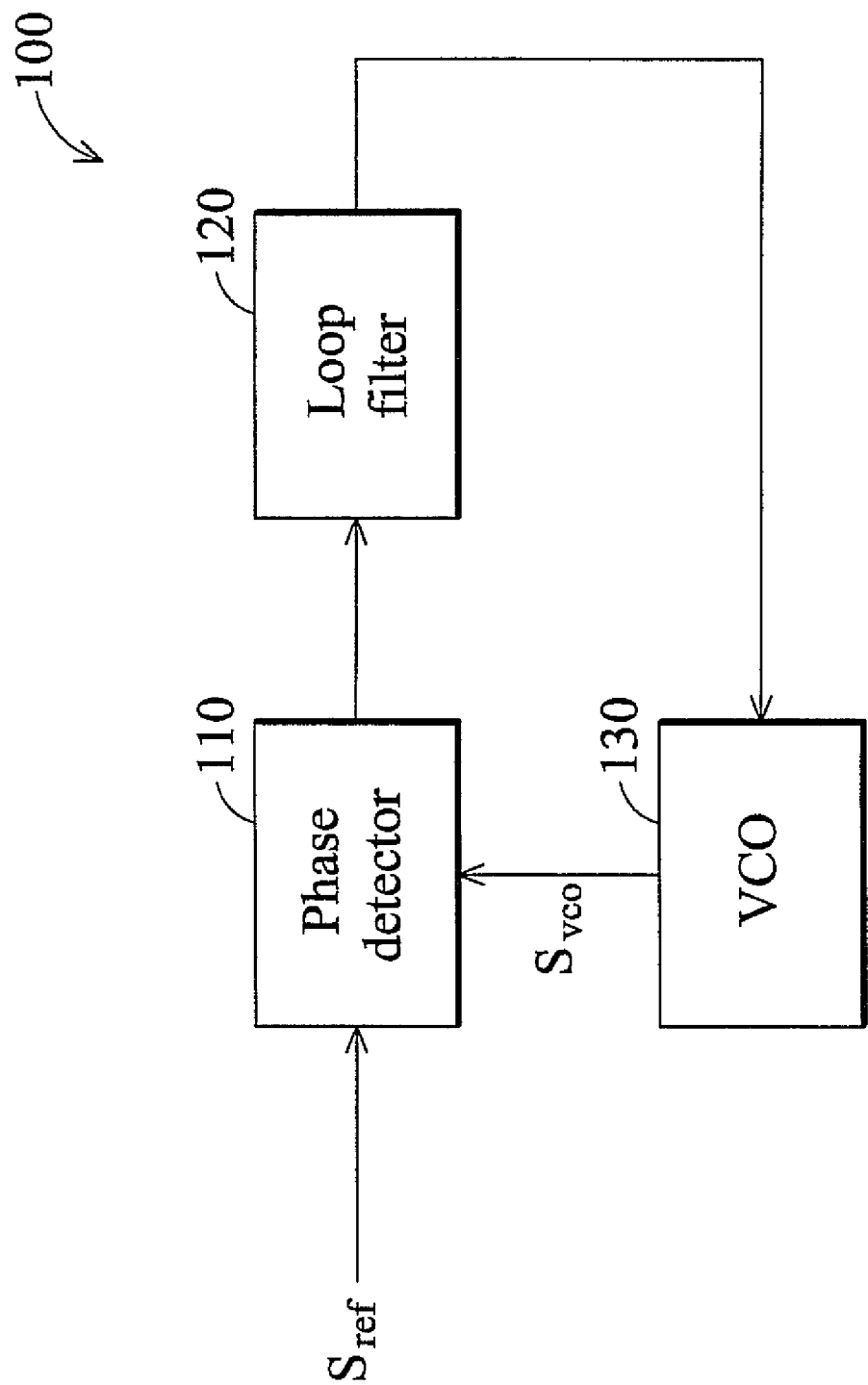
FIG. 1 is a block diagram of conventional PLL 100.
Figure 2:
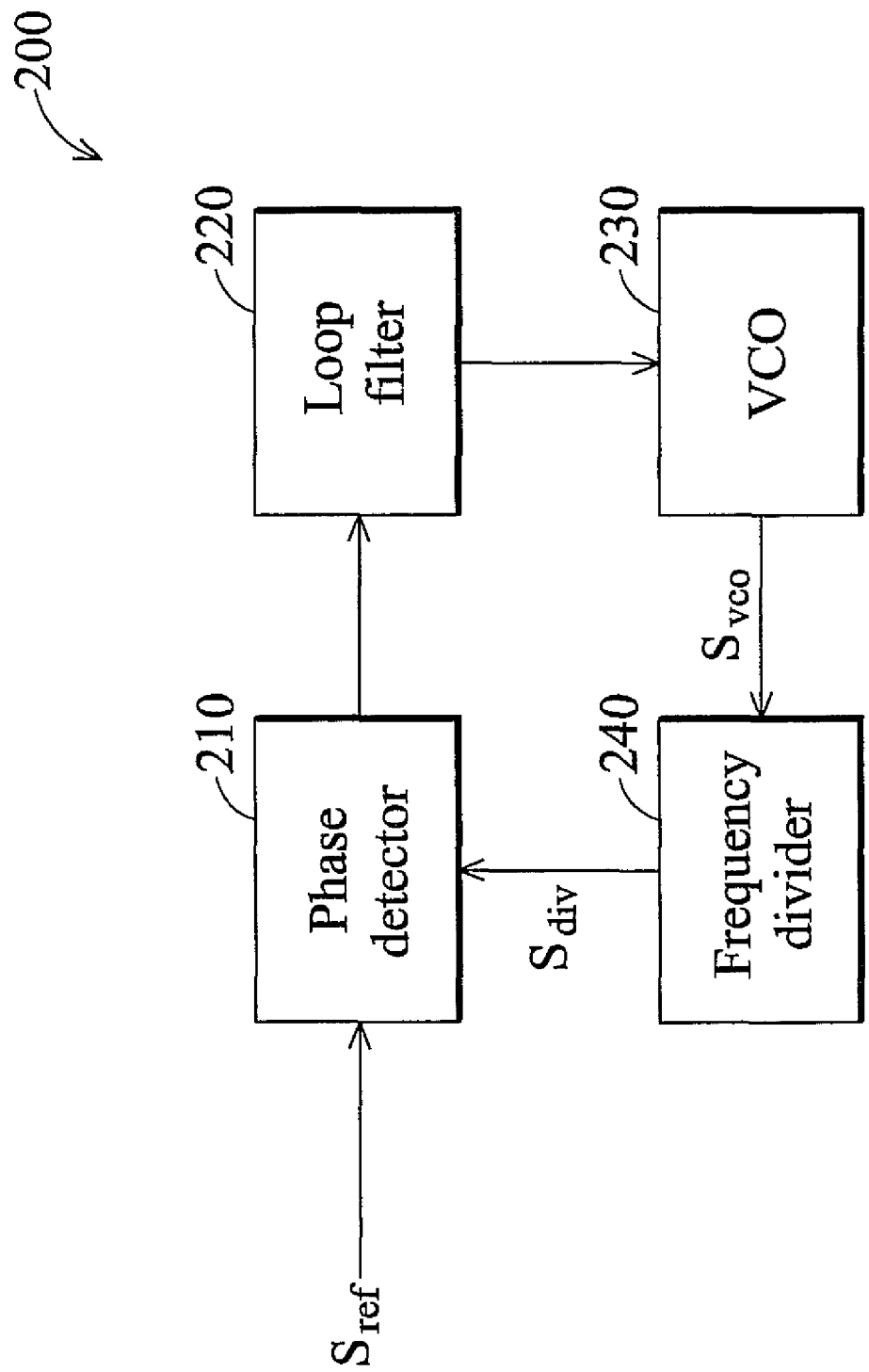
FIG. 2 is a block diagram of a conventional PLL frequency synthesizer 200.
Figure 3:
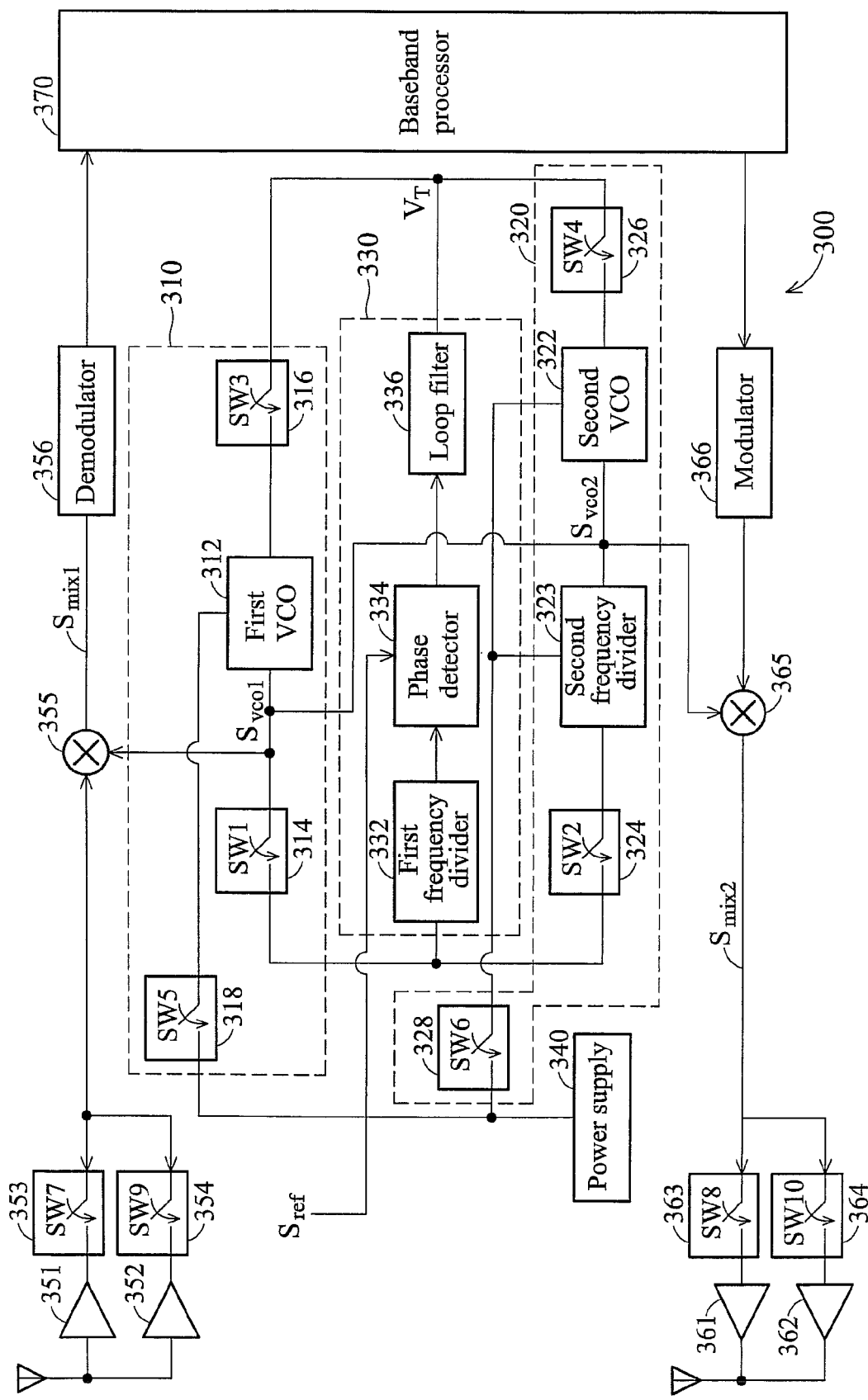
FIG. 3 is a block diagram of multi-band electronic apparatus 300 according to the invention.

FIG. 3 is a block diagram of multi-band electronic apparatus 300 according to the invention. Multi-band electronic apparatus 300 is a transceiver supporting operations at various frequency band for various telecommunication standards, for explanation, two frequency bands is taken as an example, such as 2.4~2.5 GHz and 5.0~6.0 GHz. multi-band electronic apparatus 300 comprises first circuit 310, second circuit 320, third circuit 330, power supply 340, low noise amplifiers 351 and 352, power amplifiers 361 and 362, switches 353, 354, 363, and 364, mixers 355 and 365, demodulator 356 modulator 366, and baseband processor 370. First circuit 310 comprises first voltage controlled oscillator 312, first switch 314, third switch 316, and fifth switch 318. Second circuit 320 comprises second voltage controlled oscillator 322, second frequency divider 323, second switch 324, fourth switch 326, and sixth switch 328. Third circuit 330 comprises first frequency divider 332, phase detector 334, and loop filter 336.

In order to reduce system complexity and cost, some components of PLL frequency synthesizers are shared and adopted to form two PLL frequency synthesizers covering two frequency bands. In the embodiments, two voltage controlled oscillators covering two not completely overlapped frequency bands are kept so that each of the signals at the not completely overlapped frequency band can be produced by the dedicated voltage controlled oscillator and coupled to a mixer, to maximize the mechanism sharing.

Figure 4:
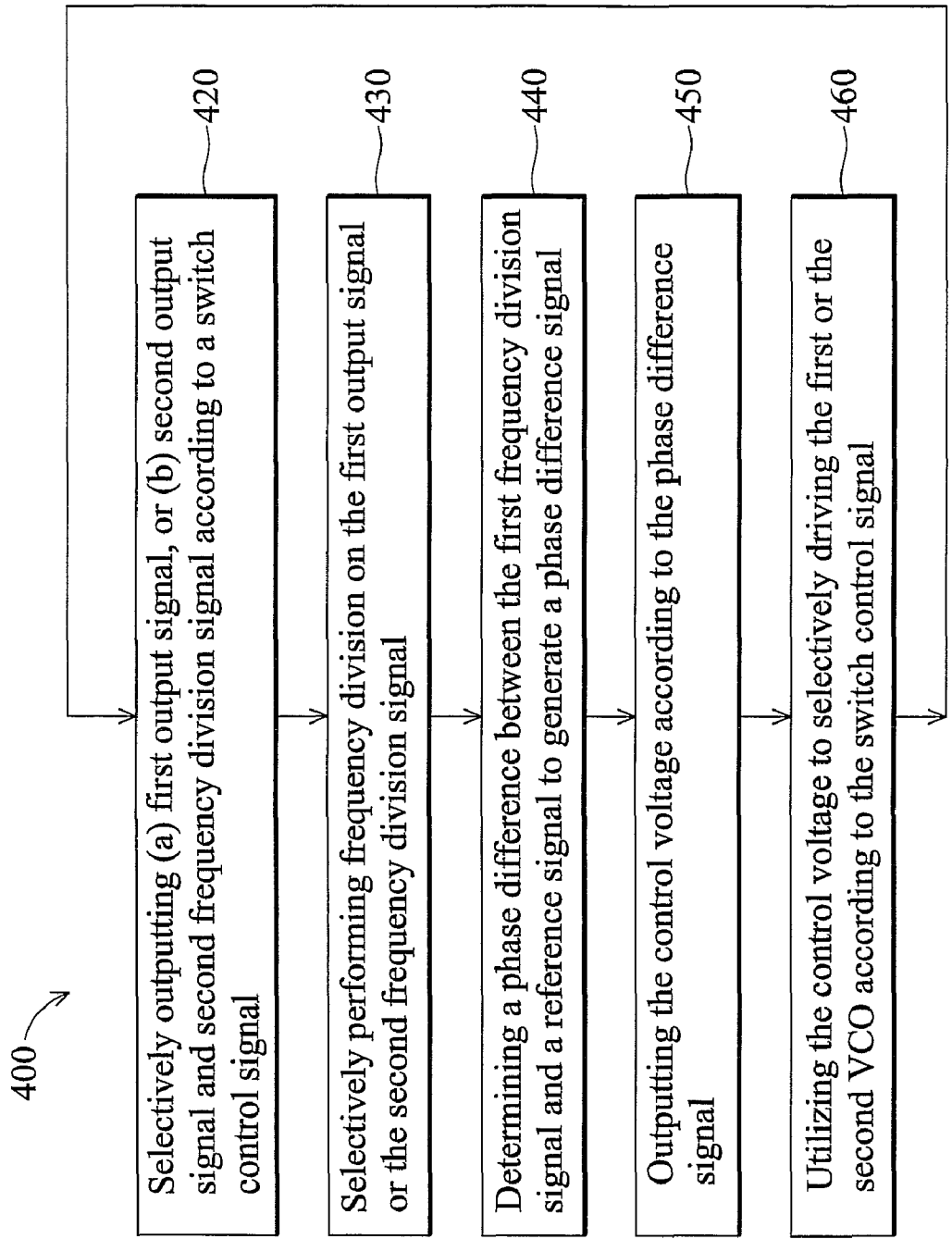
FIG. 4 is a flowchart of multi-band signal processing method 400 according to the invention.

FIG. 4 is a flowchart of multi-band signal processing method 400 according to the invention, incorporating FIG. 3 to describe the operation of multi-band electronic apparatus in 300. First voltage controlled oscillator 312 outputs first output signal $S_{vco1}$ in the first band (e.g., 2.4~2.5 GHz) according to a control voltage $V_T$ outputted by loop filter 336. A first switch set of first circuit 310 including first switch 314, third switch 316, and fifth switch 318 are coupled to first voltage controlled oscillator 312. The first switch set selectively enables first voltage controlled oscillator 312 to output first output signal $S_{vco1}$ according to a switch control signal, as 420-(a).

The switch control signal can control the connection or disconnection of the path for transmitting the control voltage $V_T$ and first output signal $S_{vco1}$, i.e., turning on or off first switch 314 and third switch 316 concurrently, so that first voltage controlled oscillator 312 outputs or stops outputting first output signal $S_{vco1}$.

In order to decrease unnecessary power consumption, decrease the signal interference from first voltage controlled oscillator 312 to other circuits, a power supply of first voltage controlled oscillator 312 may be turned off when first output signal $S_{vco1}$ is not required, so that first voltage controlled oscillator 312 stops outputting first output signal $S_{vco1}$.

Figure 5A:
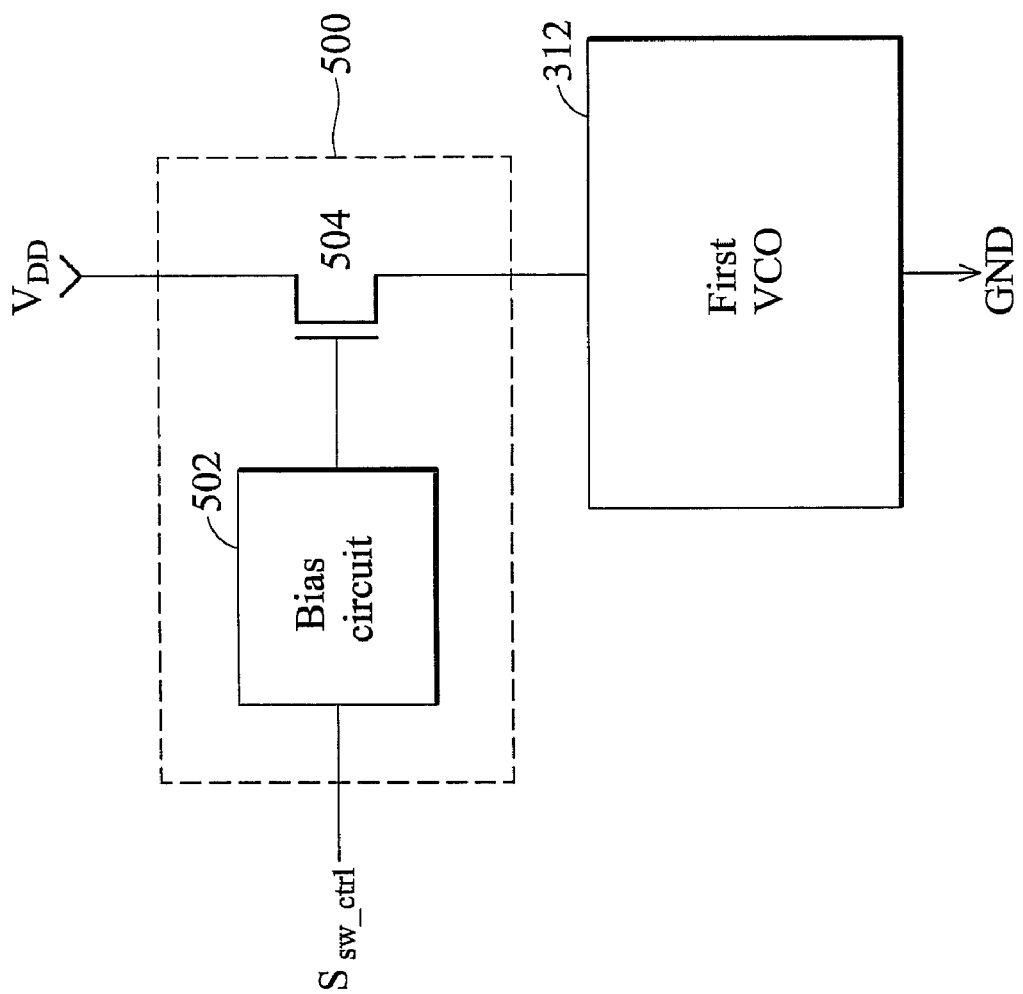
FIG. 5A is a block diagram of exemplary first power supply 500 and first voltage controlled oscillator 312 according to the invention.

Power supply 340 couples to the fifth switch 318 of first circuit 310, and power selectively supply to first voltage controlled oscillator 312 according to the switch control signal. Alternatively, utilizing a power supply controller directly couples to first voltage controlled oscillator 312 in place of fifth switch 318, selectively provides power to first voltage controlled oscillator 312 according to the switch control signal. FIG. 5A is a block diagram of exemplary first power supply controller 500 and first voltage controlled oscillator 312 according to the invention. First power supply controller 500 comprises bias circuit 502 and transistor 504. Bias circuit 502 constitutes a current mirror controlled by the switch control signal. Bias circuit 502 outputs a bias signal based on the switch control signal. Transistor 504 selectively provides a given voltage to first voltage controlled oscillator 312 according to the bias signal, or does not provide the voltage thereto. A power supply controller may be placed at the top terminal or the bottom terminal of first voltage controlled oscillator 312, to determine whether to provide power to the first voltage controlled oscillator by the switch control signal.

By selectively providing power to the first voltage controlled oscillator using the switch control signal, first switch 314 and third switch 316 may be eliminated from the circuit design, i.e., first voltage controlled oscillator 312 is coupled to third circuit 330 to directly accomplish the purpose of selectively outputting the first output signal.

If the output signal of first voltage controlled oscillator 312 is disconnected by turn-off the suppler power rather than the disconnection by first switch 314 and third switch 316, first voltage controlled oscillator 312 will may become the effect of loading for the other circuits as 330 or 320, thus affecting operations of multi-band electronic apparatus 300. Therefore, first switch 314 and third switch 316 can be controlled at off state to isolate first voltage controlled oscillator 312 and the other circuits as 320 or 330 when first output signal $S_{vco1}$ is no longer required.

Second voltage controlled oscillator 322 outputs second output signal $S_{vco2}$ according to the control voltage $V_T$ at a second frequency band, e.g., 5.0~6.0 GHz. The first frequency band and the second frequency band are not overlapped completely. Second frequency divider 323 performs frequency division on the frequency of second output signal $S_{vco2}$, e.g., divide-by-2 in frequency, and outputs a second frequency divided signal. In the embodiment, the second frequency divided signal has a frequency range at 2.5~3.0 GHz. By doing so, third circuit 330 is shared for processing signals at 2.4~3.0 GHz. Thus, all voltage controlled oscillators and frequency dividers are designed under appropriate bandwidth specifications, meeting the requirement of multi-band 2.4~2.5 GHz and 5.0~6.0 GHz, without the needs of complex circuits for ultra-wide band or two sets of complete PLL frequency synthesizer. The second switch set of second circuit 320 includes second switch 324, fourth switch 326, and sixth switch 328, coupled to second voltage controlled oscillator 322 and second frequency divider 323. The second switch set selects second frequency divider 323 to output the second frequency divided signal according to the switch control signal, as in Step 420-(b).

The switch control signal can control the connection or disconnection of the path of the control voltage $V_T$ and second output signal $S_{vco2}$, i.e., turning on or off second switch 324 and fourth switch 326 concurrently, so that second voltage controlled oscillator 322 outputs or stops outputting second output signal $S_{vco2}$.

In order to decrease unnecessary power consumption, decrease the signal interference from second voltage controlled oscillator 322 to other circuits when the second output signal $S_{vco2}$ of second voltage controlled oscillator not required, the switch control signal is utilized to control the power supply of second voltage controlled oscillator 322 and second frequency divider 323, so that second frequency divider 323 outputs or stops outputting the second frequency divided signal. The sixth switch 328 of the second power supply coupled to second circuit 320, and selectively couples to power supply 340 to control the power supply to second voltage controlled oscillator 322 and second frequency divider 323 according to the switch control signal. Alternatively, a second power supply, selectively provide power to second voltage controlled oscillator 322 and 232 according to the switch control signal. The second power supply controller may comprise two sets of bias circuits and transistors, to provide the power to second voltage controlled oscillator 322 and second frequency divider 323 separately. The detailed operation is similar to the operation of first power supply 500 and first voltage controlled oscillator 312, and is omitted here for brevity.

By controlling the power supply to second voltage controlled oscillator 322 and second frequency divider 323 so that second frequency divider 323 can only output or not output the second frequency divided signal, the requirement for second switch 324 and fourth switch 326 is thereby eliminated, i.e., second voltage controlled oscillator 322 and second frequency divider 323 are coupled to third circuit 330 directly.

If the output signal of second voltage controlled oscillator 322 and second frequency divider 323 are disconnected by turn-off the supper power rather than the disconnection by second switch 324 and fourth switch 326, second voltage controlled oscillator 322 and second frequency divider 323 will may become the effect of loading for the other circuits, as 330 or 310 thus affecting operations of multi-band electronic apparatus 300. Therefore, second switch 324 and fourth switch 326 can be controlled at off state to isolate second frequency divider 323 and second voltage controlled oscillator 322 and the other circuits as 320 or 330 when second output signal $S_{vco2}$ is no longer required.

First frequency divider 332 performs frequency division on first output signal $S_{vco1}$ or the second frequency divided signal, and outputs a first frequency divided signal, as indicated in Step 430. First frequency divider 332 may be a counter, or a frequency divider with fixed divisor, or an adaptive frequency divider with adaptable divisor.

Phase detector 334 receives the first frequency divided and stable and low noise reference signal $S_{ref}$, determines a phase difference therebetween, and outputs a phase difference signal, as in Step 440.

In Step 450, loop filter 336 outputs the control voltage $V_T$ according to the phase difference signal, and utilizes the control voltage $V_T$ to drive first voltage controlled oscillator 312 or second voltage controlled oscillator 322 to maintain a specific phase difference between the first frequency divided signal and the reference signal in Step 460. The method then returns to Step 420.

By utilizing the first and second switch sets and the switch control signal, first circuit 310 and third circuit 330 form a first PLL frequency synthesizer. The first PLL frequency synthesizer locks to reference signal $S_{ref}$, and outputs first output signal $S_{vco1}$ at the first frequency band. Similarly, the first and second switch sets and the switch control signal, second circuit 320 and third circuit 330 are utilized to form a second PLL frequency synthesizer. The second PLL frequency synthesizer locks to reference signal $S_{ref}$, and outputs second output signal $S_{vco2}$ at the second frequency band. First output signal $S_{vco1}$, and second output signal $S_{vco2}$ are provided for uses in multi-band electronic apparatus 300, for example, frequency mixing or clock generator.

Regarding the reception and transmission of signals, low noise amplifiers 351 and 352 amplifies received first and second RF signals at different frequency bands, and outputs first and second RF signals. The third switch set comprises switches 353 and 354, selectively couples the first RF signal or the second RF signal to an input terminal of mixer 355 according to the switch control signal, and the signal at the input terminal is the third RF signal. Mixer 355 is coupled to the third switch set, first voltage controlled oscillator 312, and second voltage controlled oscillator 322. The switch control signal and the first and second switch sets select a phase locked signal from either first output signal $S_{vco1}$ or second output signal $S_{vco2}$, and the phase locked signal and the third RF signal are mixed for outputting first mixed signal $S_{mix1}$. Demodulator 356 is coupled to mixer 355 to perform demodulation on first mixed signal $S_{mix1}$, and outputs a demodulated signal to baseband processor 370.

Figure 10:
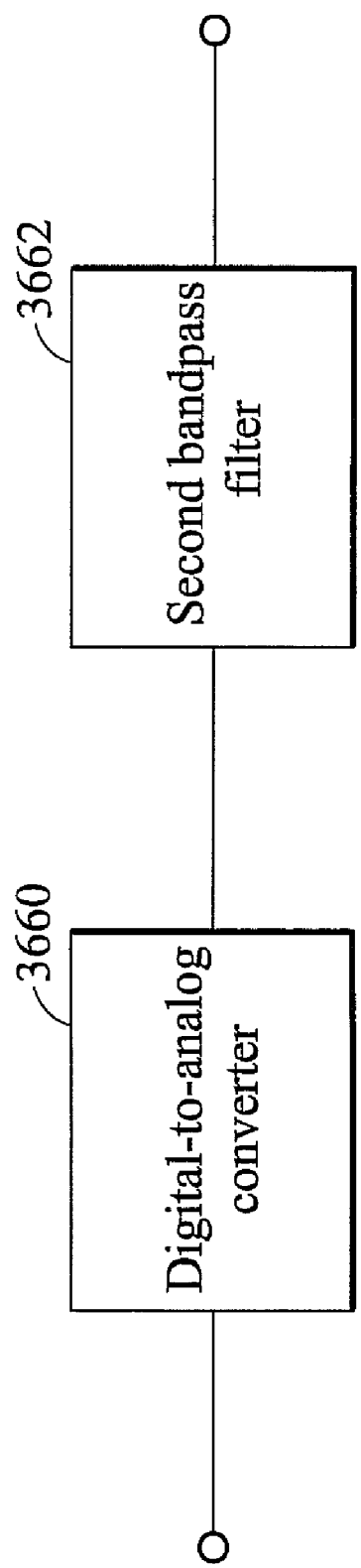
FIG. 10 is a block diagram of an exemplary modulator 366 according to the invention.

Modulator 366 performs modulation on a baseband signal from baseband processor 370 to output a modulated signal. FIG. 10 is a block diagram of an exemplary modulator 366 according to the invention, comprising digital-to-analog converter (DAC) 3660, and second bandpass filter 3662 coupled thereto. DAC 3660 receives the baseband signal (second digital signal) to convert from digital to analog and outputting an analog signal. Second bandpass filter 3662 also couples to second mixer 365 and filters the analog signal to output the modulated signal.

Mixer 365 is coupled to modulator 366, first voltage controlled oscillator 312 and second voltage controlled oscillator 322. The switch control signal and the first and second switch sets select a phase locked signal from either first output signal $S_{vco1}$ or second output signal $S_{vco2}$, and the phase locked signal and the third RF signal are mixed to output second mixed signal $S_{mix2}$. The switches 363 and 364 are utilized to selectively use power amplifiers 361 or 362 to send the second mixed RF signal $S_{mix2}$. Power amplifiers 361 and 362 amplify the second mixed RF signal at different frequency bands, or alternative, combine both into a wideband power amplifier using conventional art.

Figure 5B:
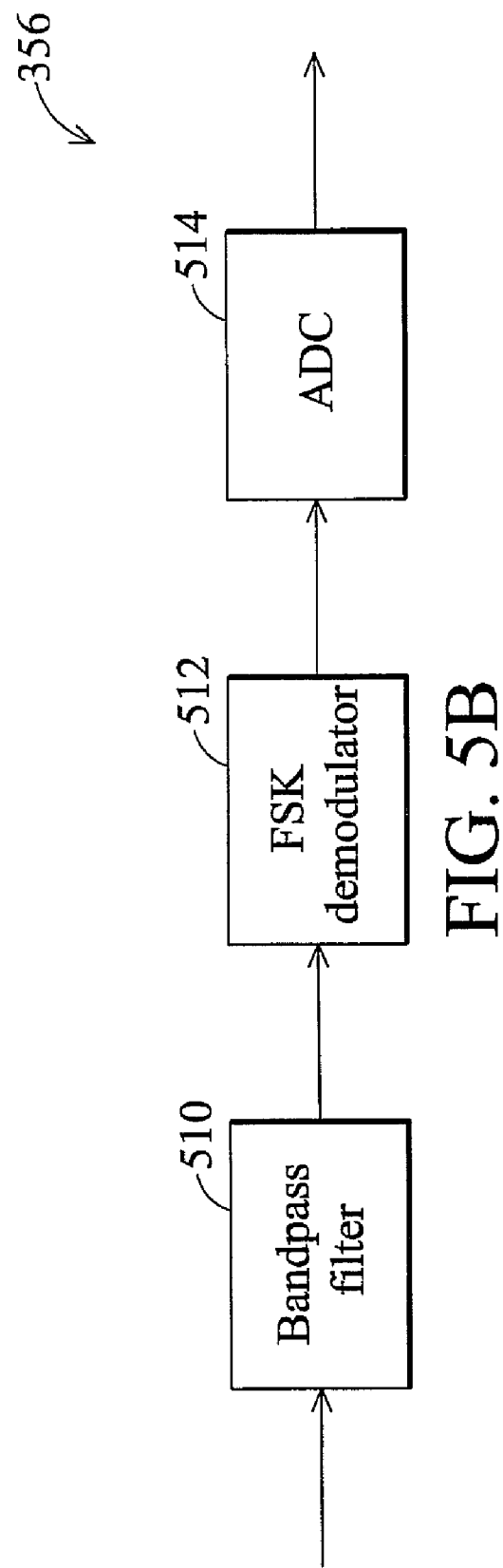
FIG. 5B is a block diagram of exemplary demodulator 356 according to the invention.

FIG. 5B is a block diagram of exemplary demodulator 356 according to the invention. Demodulator 356 comprises bandpass filter 510, Frequency Shift Keying (FSK) demodulator 512, and analog-to-digital converter (ADC) 514. Bandpass filter 510 is coupled to mixer 355 to perform filtering on the mixed signal and output a first bandpass signal. FSK demodulator 512 is coupled to bandpass filter 510 to perform frequency shift keying demodulation and output a FSK demodulated signal. Analog-to-digital converter 514 performs analog to digital conversion on the FSK demodulated signal, and outputs a digital signal. Analog-to-digital converter 514 may be a data slicer determining data as 0 or 1 by a voltage signal.

Figure 5C:
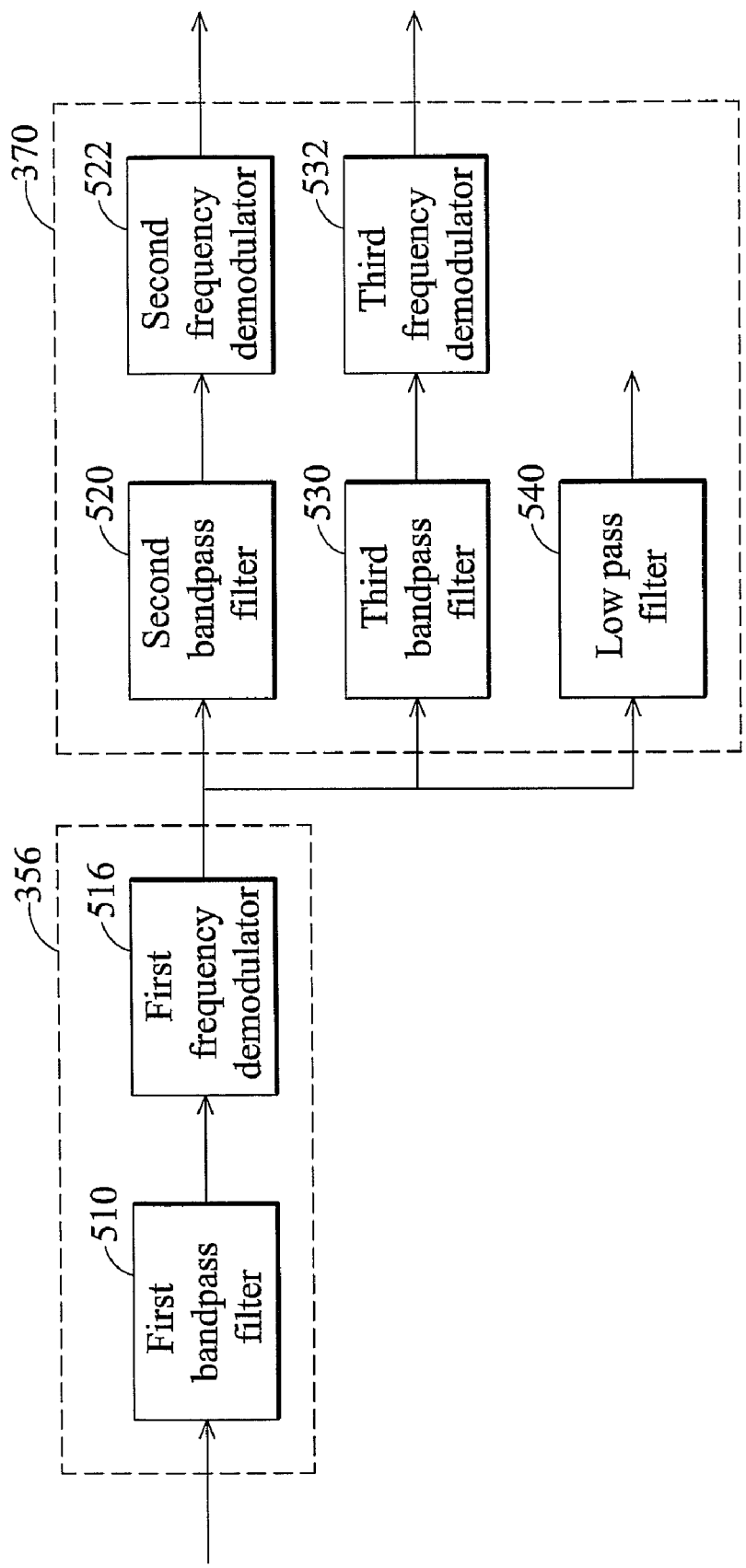
FIG. 5C is a block diagram of exemplary demodulator 356 and baseband processor 370 according to the invention.

FIG. 5C is a block diagram of exemplary demodulator 356 and baseband processor 370 according to the invention. Demodulator 356 comprises first bandpass filter 510 and first frequency modulation demodulator 516. First bandpass filter 510 is coupled to mixer 355 to filter the mixed signal, and output a first bandpass signal. First frequency modulation demodulator 516 is coupled to first bandpass filter 510 to perform demodulation on the bandpass signal, and outputs a first demodulated signal. Baseband processor 370 is coupled to first frequency modulation demodulator 516, comprising second bandpass filter 520, third bandpass filter 530, and second frequency modulation demodulator 522, third frequency modulation demodulator 532, and low pass filter 540. Second bandpass filter 520 filters the first demodulated signal, and retrieves a second bandpass signal from the first demodulated signal. Second frequency modulation demodulator 522 performs demodulation on the second bandpass signal to output a first baseband signal as audio1. Third bandpass filter 530 filters the first demodulated signal to retrieve a third bandpass signal. Third frequency modulation demodulator 532 performs demodulation on the third bandpass signal to output a second baseband signal as audio2. Low pass filter 540 filters the first demodulated signal to retrieve a video signal from the first demodulated signal.

Figure 6:
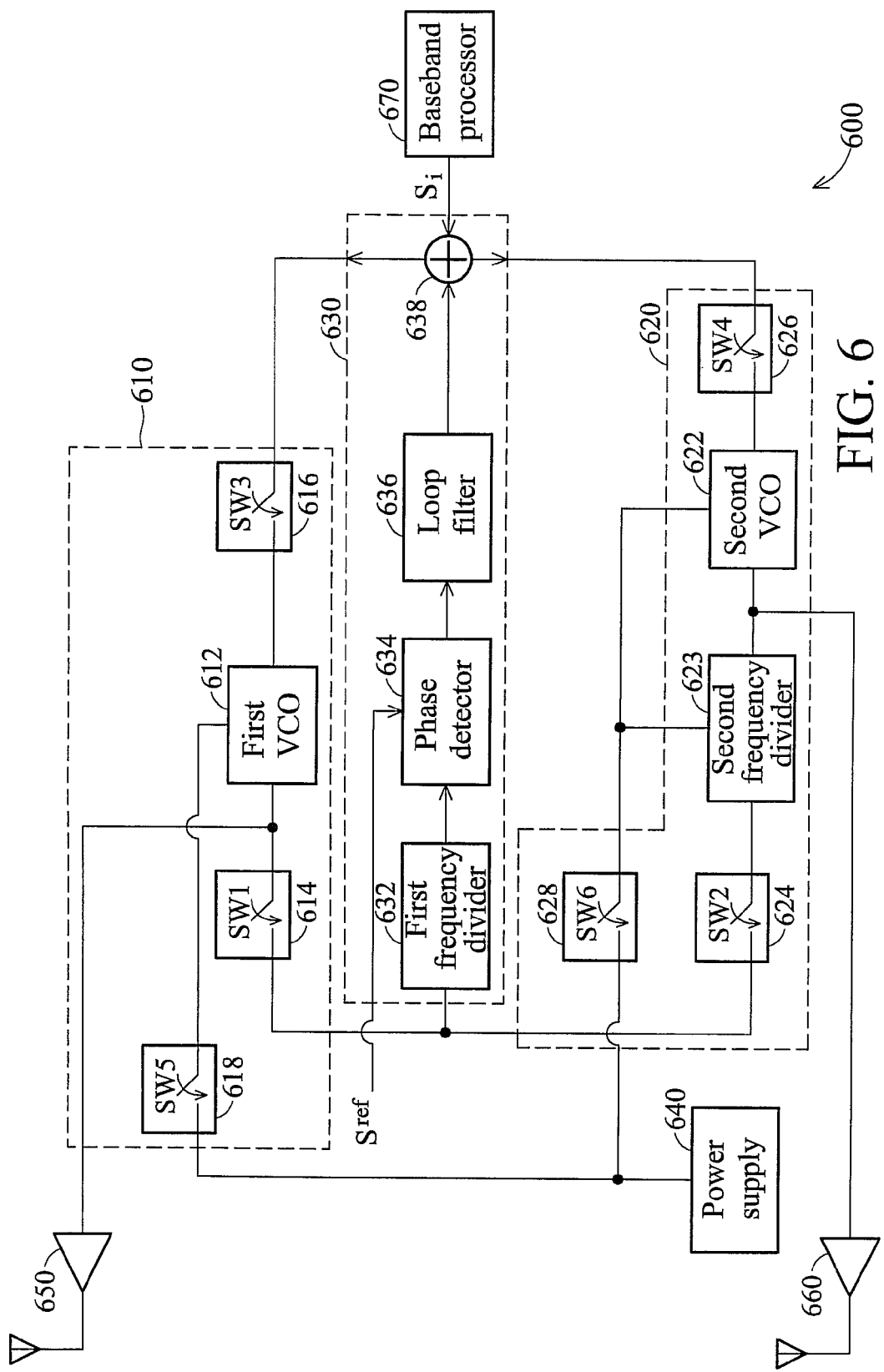
FIG. 6 is a block diagram of exemplary multi-band electronic apparatus 600 according to the invention.

FIG. 6 is a block diagram of exemplary multi-band electronic apparatus (frequency modulation transmitter) 600 according to the invention. Multi-band electronic apparatus 600 is a transmitter for modulating the frequency and supporting dual-band operations, for example, at 2.4 GHz and 5.8 GHz. multi-band electronic apparatus 600 comprises first circuit 610, second circuit 620, third circuit 630, power supply 640, power amplifiers 650 and 660, and baseband processor 670. First circuit 610 comprises first voltage controlled oscillator 612, first switch 614, third switch 616, and fifth switch 618. Second circuit 620 comprises second voltage controlled oscillator 622, second frequency divider 623, second switch 624, fourth switch 626, and sixth switch 628. Third circuit 630 comprises first frequency divider 632, first phase detector 634, loop filter 636, and first adder 638.

In order to reduce system complexity and cost, the third circuit 630 of multi-band frequency modulated transmitter are shared and adopted to form two transmitters covering two frequency bands. In the embodiments, two voltage controlled oscillators covering two frequency bands are kept so that each of the signals at the frequency bands can be produced by the dedicated voltage controlled oscillator and transmitted to a mixer, to maximize mechanism sharing.

Figure 7:
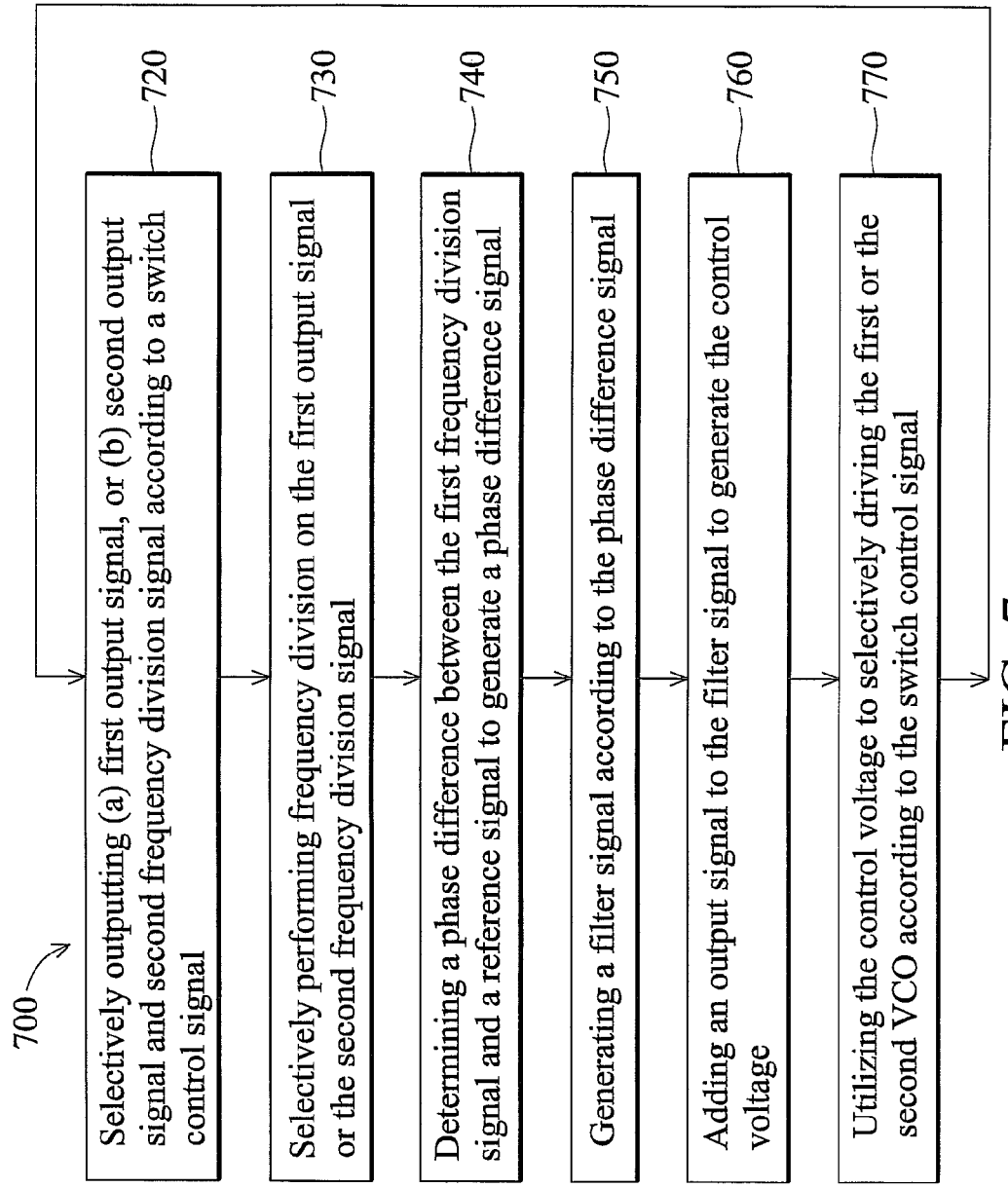
FIG. 7 is a flowchart of multi-band signal processing method 700 according to the invention.

FIG. 7 is a flowchart of multi-band signal processing method 700 according to the invention, incorporating FIG. 6 to describe the operation of multi-band electronic apparatus in 600. First voltage controlled oscillator 612 outputs first output signal $S_{vco1}$ in a first band (e.g., a frequency band centered at 2.4 GHz) according to a control voltage. A first switch set of first circuit 610 including first switch 614, third switch 616, and fifth switch 618 are coupled to first voltage controlled oscillator 612. The first switch set selectively enables first voltage controlled oscillator 612 to output first output signal $S_{vco1}$ according to a switch control signal, as 720-(a).

The switch control signal can control the connection or disconnection of the path of the control voltage for first voltage controlled oscillator and first output signal $S_{vco1}$, i.e., turning on or off first switch 614 and third switch 616 concurrently, so that first voltage controlled oscillator 612 outputs or stops outputting first output signal $S_{vco1}$.

In order to decrease unnecessary power consumption, decrease the signal interference from first voltage controlled oscillator 612 to other circuits, a power supply of first voltage controlled oscillator 612 may be turned off when first output signal $S_{vco1}$ is not required, so that first voltage controlled oscillator 612 stop outputting first output signal $S_{vco1}$.

Power supply 640 couples to the fifth switch 618 of first circuit 610, and power selectively supply to first voltage controlled oscillator 612 according to the switch control signal. Alternatively, utilizing a power supply controller directly couples to first voltage controlled oscillator 612 in place of fifth switch 618, selectively provides power to first voltage controlled oscillator 612 according to the switch control signal. The detailed operation is similar to the operations of first power supply 500 and first voltage controlled oscillator 312 and is not repeated here again for brevity.

Meanwhile, first switch 614 and third switch 616 may be eliminated from the circuit design, i.e., first voltage controlled oscillator 612 is coupled to third circuit 630. The detailed operation is similar to [0031].

If the power supply of first voltage controlled oscillator 612 is disconnected by turning off the supplier power rather than the disconnection by first switch 614 and third switch 616, first voltage controlled oscillator 612 may become the loading for the other circuits as 630 or 620, thus affecting operations of multi-band electronic apparatus 600. Therefore, first switch 614 and third switch 616 can be controlled at off-state to isolate first voltage controlled oscillator 612 and the other circuits as 620 or 630 when first output signal $S_{vco1}$ is no longer required.

Second voltage controlled oscillator 622 outputs second output signal $S_{vco2}$ according to the control voltage at a second frequency band, e.g., a frequency band centered at 5.8 GHz. Second frequency divider 623 performs frequency division on the frequency of second output signal $S_{vco2}$, e.g., divide-by-2 in frequency, and outputs the frequency of a second frequency divided signal close to or in the range of the first frequency band. Thus, third circuit 630 is shared for processing signals at proximity to the first frequency band. The switch set of second circuit 620 including second switch 624, fourth switch 626, and sixth switch 628 is coupled to second voltage controlled oscillator 622 and second frequency divider 623. The switch set of second circuit select second frequency divider 623 to output the second frequency divided signal according to the switch control signal, as in step 720-(b).

The switch control signal can control the connection or disconnection of the path for the control voltage of second voltage controlled oscillator and second output signal $S_{vco2}$, i.e., turning on or off second switch 624 and fourth switch 626 concurrently, so that second voltage controlled oscillator 622 outputs or stops outputting second output signal $S_{vco2}$.

In order to decrease unnecessary power consumption, decrease the signal interference from second voltage controlled oscillator 622 to other circuits the switch control signal is utilized to control the power supply of second voltage controlled oscillator 622 and second frequency divider 623, so that second frequency divider 623 outputs or stops outputting the second frequency divided signal.

Power supply 640 couples to the sixth switch 628 of first circuit 620, and power selectively supply to second voltage controlled oscillator 622 according to the switch control signal. Alternatively, utilizing a power supply controller directly couples to second voltage controlled oscillator 622 in place of fifth switch 628, selectively provides power to second voltage controlled oscillator 622 according to the switch control signal. The detailed operation is similar to the operation of first power supply 500 and first voltage controlled oscillator 312, and is not repeated here.

Thus, second switch 624 and fourth switch 626 may be eliminated, i.e., second voltage controlled oscillator 622 and second frequency divider 623 are coupled to third circuit 630 directly. The detailed operation is similar to [0031].

If the power supply of second voltage controlled oscillator 622 is disconnected by turn-off the suppler power rather than the disconnection by second switch 624 and fourth switch 626, second voltage controlled oscillator 622 may become the effect of loading for the other circuits as 630 or 610, thus affecting operations of multi-band electronic apparatus 600. Therefore, second switch 624 and fourth switch 626 can be controlled at off-state to isolate second voltage controlled oscillator 622 and the other circuits as 610 or 630 when second output signal $S_{vco2}$ is no longer required.

First frequency divider 632 performs frequency division on first output signal $S_{vco1}$ or the second frequency divided signal, and outputs a first frequency divided signal, as indicated in Step 730. First frequency divider 632 may be a counter, or a frequency divider with fixed divisor, or an adaptive frequency divider with adaptable divisor.

First phase detector 634 receives the first frequency divided signal and stable and low noise reference signal $S_{ref}$, determines a phase difference therebetween, and outputs a phase difference signal, as in Step 740.

In Step 750, loop filter 636 is coupled to first phase detector 634, and generates a filtered signal based on the phase difference signal.

Specifically, loop filter 636 is coupled to a adder 638, and the filtered signal is added by input signal Si from baseband processor 670 to generate the control signal in Step 760, and utilizes the control voltage to drive first voltage controlled oscillator 612 or second voltage controlled oscillator 622 as in Step 770.

By utilizing the first and second switch sets and the switch control signal, first circuit 610 and third circuit 630 selectively form a first band modulator. The modulator performs modulation on input signal Si to output first output signal $S_{vco1}$ at the first band. Similarly, by utilizing the first and second switch sets and the switch control signal, second circuit 620 and third circuit 630 form a second band modulator. The modulator performs modulation on input signal Si to output second output signal $S_{vco2}$ at the second band. The second output signal is a modulated signal at the second frequency band. Power amplifiers 650 and 660 amplify and output first and second amplified signals, respectively. Next, an antenna is used to transmit the first and second amplified signal.

Figure 8:
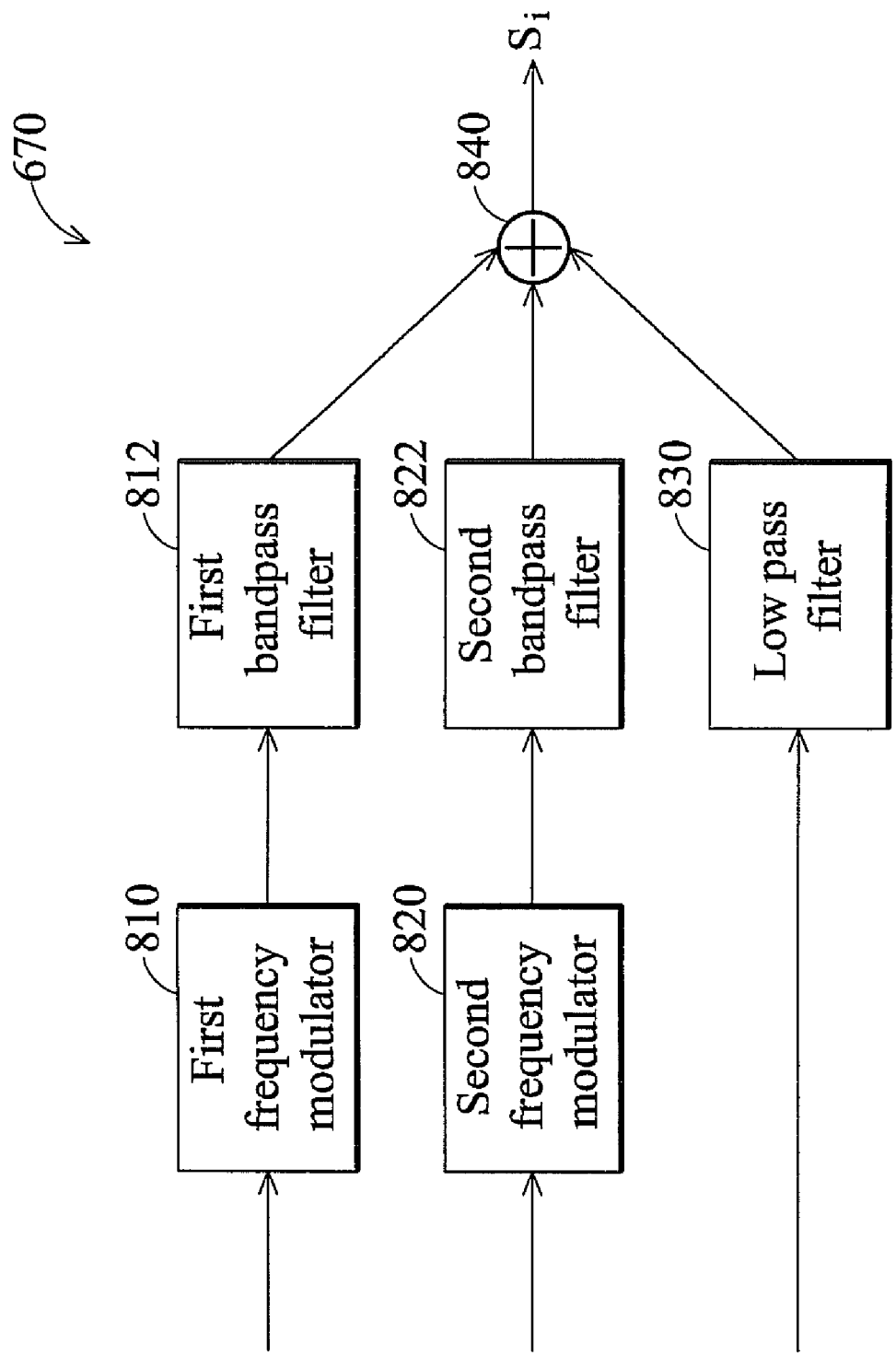
FIG. 8 is a block diagram of exemplary baseband processor 670 according to the invention.

FIG. 8 is a block diagram of exemplary baseband processor 670 according to the invention. Baseband processor 670 comprises first modulator 810, second modulator 820, first bandpass filter 812, second bandpass filter 822, low pass filter 830, and adder 840. First modulator 810 modulates a first audio signal to output a first modulated signal. First bandpass filter 812 filters the first modulated signal to output a first bandpass signal. Second modulator 820 performs modulation on a second audio signal to output a second modulated signal. Second bandpass filter 822 filters the second modulated signal to output a second bandpass signal. Low pass filter 830 filters a video signal to output a filtered video signal. A adder 840 adds the first and second bandpass signals to generate Si.

Figure 9:
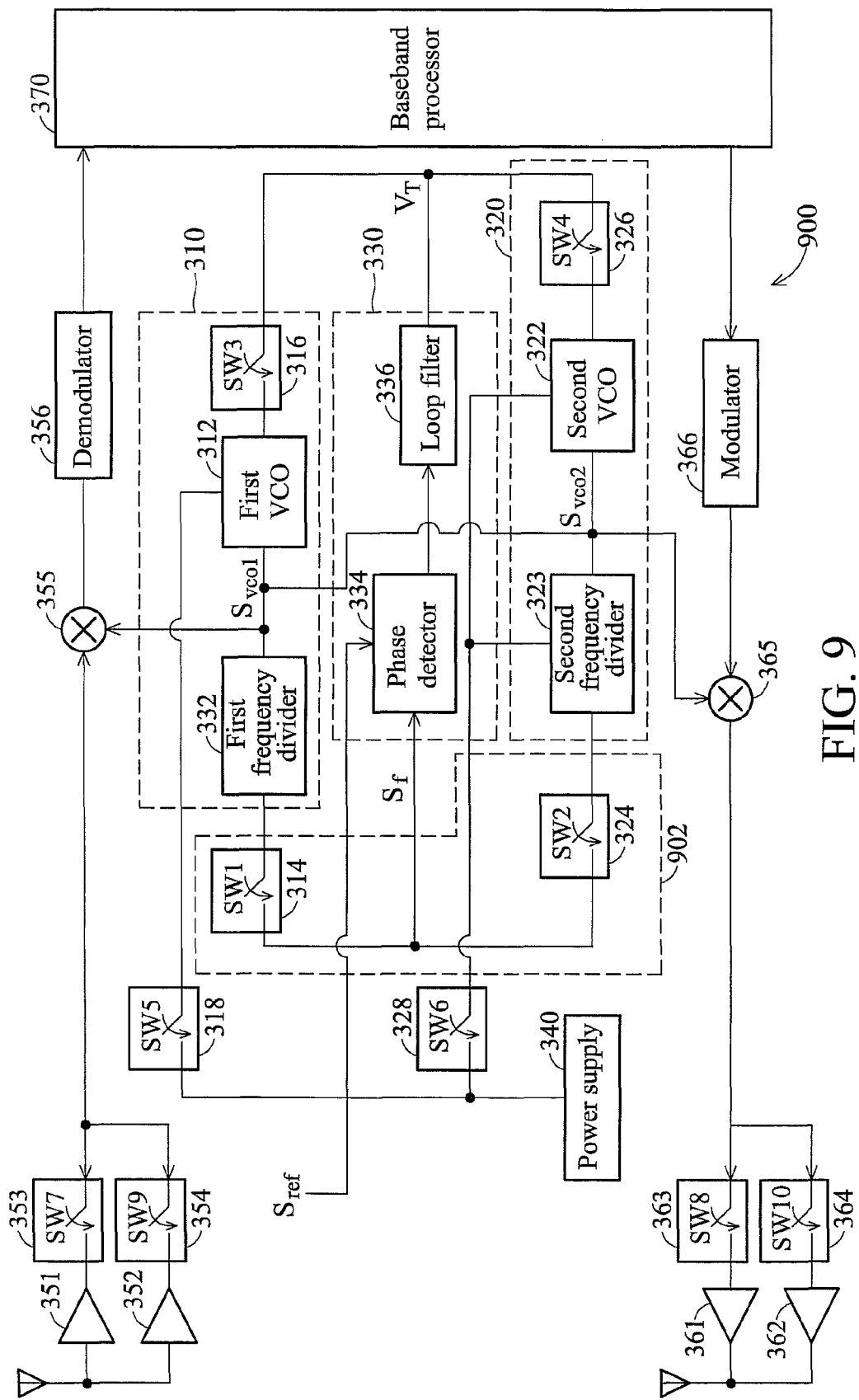
FIG. 9 is a block diagram of yet another exemplary multi-band electronic apparatus 900 according to the invention.

FIG. 9 is a block diagram of yet another exemplary multi-band electronic apparatus 900 according to the invention. For simplicity, the components identical to those in FIG. 3 use identical numbering and denotation.

Multi-band electronic apparatus 900 in FIG. 9 comprises phase detector 334 determined a phase difference signal between reference signal $S_{ref}$ and frequency signal $S_f$, and loop filter 336 coupled to phase detector 334, outputs a control voltage according to the phase difference signal. Phase detector 334 and loop filter 336 constitutes shared third circuit 330.

Multi-band electronic apparatus 900 further comprises first voltage controlled oscillator 312 coupled to loop filter 336, outputting first output signal $S_{vco1}$ at the first band upon reception of the control voltage signal $V_T$, and first frequency divider 332 coupled to first voltage controlled oscillator 312, performing frequency division on first output signal $S_{vco1}$ upon reception of first output signal $S_{vco1}$. First voltage controlled oscillator 312 and first frequency divider 332 constitutes first circuit 310.

Multi-band electronic apparatus 900 further comprises second voltage controlled oscillator 322 coupled to loop filter 336, outputting second output signal $S_{vco2}$ in the second band upon reception of the control voltage signal $V_T$, and second frequency divider 323 coupled to second voltage controlled oscillator 322, performing frequency division on Svco3 upon reception of Svco3. Second voltage controlled oscillator 322 and second frequency divider 323 constitutes a second circuit 320.

Multi-band electronic apparatus 900 also comprises selection apparatus 302 coupled to the first and second frequency divided signals, and determined to output the first or the second frequency divided signals as frequency signal $S_f$ based on a switch control signal (now shown in FIG. 9). Selection apparatus 902 may be a two-to-one multiplexer, or first switch 314 and second switch 324 (as shown in FIG. 9). First switch 314 and second switch 324 are controlled by the switch control signal. When first switch 314 is turned on, second switch 324 is off, and vice versa, thereby selecting the first or the second frequency divided signal as frequency signal $S_f$.

First circuit 310 further comprises third switch 316, first voltage controlled oscillator 312, and first frequency divider 332. Second circuit 320 further comprises fourth switch 326, second voltage controlled oscillator 322 and second frequency divider 323. In the embodiment, third switch 316 turns on or off the path between loop filter 336 and first voltage controlled oscillator 312 according switch control signal, and fourth switch 326 turn-on or off the path between loop filter 336 and second voltage controlled oscillator 322.

Third switch 316 and fourth switch 326 are controlled by the switch control signal. The connection status of third switch 316 and fourth switch 326 are complementary. When first switch 314 is turned on, third switch 316 is also on. Similarly, when second switch 324 is turned on, fourth switch 326 is also on.

For the purpose of power saving, fifth switch 318 may disconnect first voltage controlled oscillator 312 and its power supply (power supply 340). Fifth switch 318 is controlled by the switch control signal, and when second switch 324 is turned on to output the second frequency divided signal, fifth switch 318 is turned off to disconnect the power of first voltage controlled oscillator 312, to achieve power saving. Likewise, sixth switch 328 may disconnect second voltage controlled oscillator 322 and its power supply (power supply 340). Sixth switch 328 is controlled by the switch control signal, and when first switch 314 is turned on to output the first frequency divided signal, sixth switch 328 is turned off to disconnect the power of second voltage controlled oscillator 322, to also achieve power saving.

Referring to FIG. 3 or 9, first circuit 310 and second circuit 320 may share third circuit 330 through controlling first switch 314 to fifth switch 318 and second switch 324 to sixth switch 328, to output first output signal $S_{vco1}$ and second output signal $S_{vco2}$ supporting two-band electronic apparatus. The embodiments of the invention are not limited to two bands, additional circuits and voltage controlled oscillators at different bands may be added and in conjunction with corresponding switch controls to expand the compatibility to other telecommunication specifications and frequency bands. Likewise, with reference to FIG. 6, additional circuits of voltage controlled oscillators as fourth circuit may be added in parallel with second circuit 310 or second circuit 320 and in conjunction with corresponding switch controls, to expand the compatibility to other telecommunication specifications in different frequency band.

The technology according to the invention utilizes switches and switch control signals to share some components of PLL frequency synthesizers to form multiple PLL frequency synthesizers, thereby reducing the complexity and cost of electronic telecommunication apparatuses supporting two or more telecommunication specifications.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multi-band electronic apparatus, comprising:
a first circuit, comprising:
a first voltage controlled oscillator, outputting a first output signal in a first band according a control voltage; and
a first switch set, coupled to the first voltage controlled oscillator, selectively enabling the first voltage controlled oscillator to output the first output signal; according to a switch control signal;
a second circuit, comprising:
a second voltage controlled oscillator, outputting a second output signal in a second band according the control voltage, wherein the first and second bands are not completely overlapped;

a second frequency divider, coupled to the second voltage controlled oscillator, dividing frequency of the second output signal to output a second frequency divided signal; and a second switch set coupled to the second voltage controlled oscillator and the second frequency divider, selectively enabling the second voltage controlled oscillator to output the second output signal and the second frequency divider to output the second frequency divided signal;

a third circuit, comprising:
a first frequency divider, dividing frequency of the first output signal or the second frequency divided signal to output a first frequency divided signal;
a phase detector, coupled to the first frequency divider, receiving the first frequency divided signal and a reference signal, determining a phase difference between the first frequency divided signal and the reference signal to output a phase difference signal; and a loop filter, coupled to the phase detector, outputting the control voltage according to the phase difference signal.

2. The multi-band electronic apparatus of claim 1, wherein the first switch set further comprises:
a first switch, coupled to the first voltage controlled oscillator, and selectively coupled to the first frequency divider according to the switch control signal; and
a third switch, coupled to the first voltage controlled oscillator, and selectively coupled to the loop filter according to the switch control signal; and
the second switch set further comprises:
a second switch, coupled to the second frequency divider, and selectively coupled to the first frequency divider according to the switch control signal; and
a fourth switch, coupled to the second voltage controlled oscillator, and selectively coupled to the loop filter according to the switch control signal.

3. The multi-band electronic apparatus of claim 2, wherein:
the first circuit further comprises a first power supply controller, coupled to the first voltage controlled oscillator, selectively providing power to the first voltage controlled oscillator according to the switch control signal; and
the second circuit further comprises a second power supply controller, coupled to the second voltage controlled oscillator and the second frequency divider, selectively providing power thereto according to the switch control signal.

4. The multi-band electronic apparatus of claim 1, wherein:
the first switch set further comprises a fifth switch, coupled to a power supply of the first circuit, and selectively coupled to a power supply according to the switch control signal; and
the second switch set further comprises a sixth switch, coupled to a power supply of the second circuit, and selectively coupled to the power supply according to the switch control signal.

5. The multi-band electronic apparatus of claim 4, wherein the first switch set further comprises:
a first switch, coupled to a first voltage controlled oscillator, and selectively coupled to the first frequency divider according to the switch control signal; and
a third switch, coupled to a first voltage controlled oscillator, and selectively coupled to the loop filter according to the switch control signal; and
the second switch set further comprises:
a second switch, coupled to the second frequency divider, and selectively coupled to the first frequency divider according to the switch control signal; and
a fourth switch, coupled to a second voltage controlled oscillator, and selectively coupled to the loop filter according to the switch control signal.

6. The multi-band electronic apparatus of claim 1, wherein:
the first circuit further comprises a first power supply, coupled to the first voltage controlled oscillator, providing power thereto according to the switch control signal; and
the second circuit further comprises a second power supply, coupled to the second voltage controlled oscillator, providing power thereto according to the switch control signal.

7. The multi-band electronic apparatus of claim 6, wherein the first switch set further comprises:
a first switch, coupled to a first voltage controlled oscillator, and selectively coupled to the first frequency divider according to the switch control signal; and
a third switch, coupled to a first voltage controlled oscillator, and selectively coupled to the loop filter according to the switch control signal; and
the second switch set further comprises:
a second switch, coupled to the second frequency divider, and selectively coupled to the first frequency divider according to the switch control signal; and
a fourth switch, coupled to a second voltage controlled oscillator, and selectively coupled to the loop filter according to the switch control signal.

8. The multi-band electronic apparatus of claim 1, wherein the third circuit further comprises:
a first adder, coupled to the loop filter, adding an input baseband signal on the filtered signal to generate the control voltage.

9. The multi-band electronic apparatus of claim 8, wherein the first switch set further comprises:
a first switch, coupled to the first voltage controlled oscillator, and selectively coupled to the first frequency divider according to the switch control signal; and
a third switch, coupled to the first voltage controlled oscillator, and selectively coupled to the first adder according to the switch control signal; and
the second switch set further comprises:
a second switch, coupled to the second frequency divider, and selectively coupled to the first frequency divider according to the switch control signal; and
a fourth switch, coupled to the second voltage controlled oscillator, and selectively coupled to the first adder according to the switch control signal.

10. The multi-band electronic apparatus of claim 8, wherein the baseband processor, coupled to the first adder, outputting the output signal, comprising:
a first frequency modulator, modulating a first signal to output a first modulated signal;
a first bandpass filter, filtering the first modulated signal to output a first bandpass signal;
a second frequency modulator, modulating a second signal to output a second modulated signal;
a second bandpass filter, filtering the second demodulated signal to output a second bandpass signal;
a low pass filter, filtering a third signal to output a filtered signal; and
a second adder, adding the first and second bandpass signals with the a third filtered signal to generate the output signal.

11. A multi-band electronic apparatus, comprising:
a first circuit, comprising: a first voltage controlled oscillator, outputting a first output signal in a first band according a control voltage;

a second circuit, comprising:
a second voltage controlled oscillator, outputting a second output signal in a second band according the control voltage, wherein the first and second bands are not completely overlapped; and
a second frequency divider, coupled to the second voltage controlled oscillator, dividing frequency of the second output signal to output a second frequency divided signal;
a third circuit, comprising:
a first frequency divider, dividing frequency of the first output signal or the second frequency divided signal to output a first frequency divided signal;
a phase detector, coupled to the first frequency divider, receiving the first frequency divided signal and a reference signal, determining a phase difference between the first frequency divided signal and the reference signal to output a phase difference signal;
a loop falter, coupled to the phase detector, outputting the control voltage according to the phase difference signal; and
a control signal switch, selectively controlling the first voltage controlled oscillator to output the first output signal to the first frequency divider and controlling the loop filter to output the control voltage to the first voltage controlled oscillator, or controlling the second voltage controlled oscillator to output the second output signal and the second frequency divider to output the second frequency divided signal to the first frequency divider, and direct the loop filter to output the control voltage to the second voltage controlled oscillator.

12. The multi-band electronic apparatus of claim 11, further comprising:
a third switch set, selectively receiving a first RF signal or a second RF signal to output a third RF signal;
a mixer, coupled to the third switch set, and the first and second voltage controlled oscillators, mixing the first or second output signal with the third RF signal to output a mixed signal; and
a demodulator, coupled to the mixer, demodulating the mixed signal.

13. The multi-band electronic apparatus of claim 12, wherein the demodulator further comprises:
a first bandpass filter, coupled to the mixer, filtering the mixed signal to output a first bandpass signal;
a first frequency demodulator, coupled to the first bandpass filter, demodulating the first bandpass signal to a first demodulated signal; and
a baseband processor, coupled to the frequency demodulator, comprising:
a second bandpass filter, filtering the first demodulated signal to output a second bandpass signal;
a third bandpass filter, filtering the first demodulated signal to output a third bandpass signal;
a second frequency demodulator, demodulating the second bandpass signal to output a first audio signal; and
a third frequency demodulator, demodulating the third bandpass signal to output a second audio signal; and
a low pass filter, filtering the first demodulated signal to output a video signal.

14. The multi-band electronic apparatus of claim 12, wherein the demodulator further comprises:
a bandpass filter, coupled to the mixer, filtering the mixed signal to output a first bandpass signal;
a frequency shift keying (FSK) demodulator, coupled to the bandpass filter, performing FSK demodulation on the first bandpass signal to output a demodulated signal; and
an analog-to-digital converter, converting the demodulated signal from analog to digital to output a digital signal.

15. The multi-band electronic apparatus of claim 11, further comprising:
a modulator, outputting a modulated signal; and
a mixer, coupled to the modulator, the first and second voltage controlled oscillators, mixing the first or second output signal with the demodulated signal to output a mixed signal.

16. The multi-band electronic apparatus of claim 11, further comprising:
a third switch set, selectively receiving a first RF signal or a second RF signal according to the switch control signal to output a third RF signal; and
a first mixer, coupled to the third switch set, the first and second voltage controlled oscillators, mixing the first or second output signal with the third RF signal to output a first mixed signal;
a demodulator, coupled to the mixer, demodulating the first mixed signal;
a modulator, outputting a modulated signal; and
a second mixer, coupled to the modulator, the first and second voltage controlled oscillators, mixing the first or second output signal with the modulated signal to output a second mixed signal.

17. The multi-band electronic apparatus of claim 16, wherein the demodulator further comprises:
a first bandpass filter, coupled to the first mixer, filtering the first mixed signal to output a first filtered signal; and
a analog-to-digital converter (ADC), coupled to the first bandpass filter, converting the first filtered signal from analog to digital to output a first digital signal; and
the modulator further comprising:
a digital-to-analog converter (DAC), receiving a second digital signal to convert from digital to analog and outputting an analog signal; and
a second bandpass filter, coupled to the digital-to-analog converter and the second mixer, filtering the analog signal; and
the multi-band electronic apparatus further comprising a baseband processor, coupled to the analog-to-digital converter and the digital-to-analog converter, outputting the second digital signal, and processing the inputted first digital signal.

18. The multi-band electronic apparatus of claim 11, further comprising:
a first adder, coupled to the loop filter, adding an input signal on the filtered signal to generate the control voltage.

19. A method for processing multi-band signals, comprising:
outputting a first output signal in a first band selectively according to a switch control signal, and the first output signal being outputted by a first voltage controlled oscillator according to a control voltage;
outputting a second output signal in a second band selectively, according to the switch control signal, and the second output signal output by a second voltage controlled oscillator according to the control voltage, and the second band not completely overlapped with the first band;
dividing frequency of the second output signal to output a second frequency divided signal;

performing frequency division selectively on the first output signal or the second frequency divided signal according to the switch control signal, and outputting a first frequency divided signal;

determining a phase difference between the first frequency divided signal and a reference signal to output a phase difference signal;

outputting the control voltage according to the phase difference signal; and selectively driving the first or the second voltage controlled oscillators, by the control voltage, according to file switch control signal.

20. A method for processing multi-band signals, comprising:

outputting a first output signal in a first band selectively according to a switch control signal, and the first output signal being outputted by a first voltage controlled oscillator according to a control voltage;

outputting a second output signal in a second band selectively, according to the switch control signal, and the second output signal output by a second voltage controlled oscillator is according to the control voltage, and the second band is not completely overlapped with the first band;

dividing frequency of the second output signal to output a second frequency divided signal;

performing frequency division selectively on the first output signal or the second frequency divided signal according to the switch control signal, and outputting a first frequency divided signal;

determining a phase difference between the first frequency divided signal and a reference signal to output a phase difference signal;

generating a filtered signal according to the phase difference signal;

adding the filtered signal on an input signal to generate the control voltage; and selectively driving the first or the second voltage controlled oscillators, by the control voltage, according to the switch control signal.

* * * * *

UNITED STATES PATENT AND TRADEMARK OFFICE
CERTIFICATE OF CORRECTION

| | | |
|---|---|---|
| PATENT NO. | : 7,777,586 B2 | Page 1 of 1 |
| APPLICATION NO. | : 12/107532 | |
| DATED | : August 17, 2010 | |
| INVENTOR(S) | : Yi-Fong Wang and Wei-Kung Deng | |

It is certified that error appears in the above-identified patent and that said Letters Patent is hereby corrected as shown below:

Title Pg, Item (54) and Col. 1, Line 1, "Multi-Brand" in the first line of the title should appear as --Multi-Band--.

Signed and Sealed this
Thirtieth Day of August, 2011

David J. Kappos
*Director of the United States Patent and Trademark Office*